United States Patent
Loeppert et al.

(10) Patent No.: US 8,687,823 B2
(45) Date of Patent: Apr. 1, 2014

(54) MICROPHONE INTERFACE AND METHOD OF OPERATION

(75) Inventors: Peter V. Loeppert, Hoffman Estates, IL (US); Paul Fielding Smith, Barlett, IL (US); Wei-Wen Dai, Elgin, IL (US); Shawn Beus, Carpentersville, IL (US)

(73) Assignee: Knowles Electronics, LLC., Itasca, IL (US)

( * ) Notice: Subject to any disclaimer, the term of this patent is extended or adjusted under 35 U.S.C. 154(b) by 454 days.

(21) Appl. No.: 12/883,454

(22) Filed: Sep. 16, 2010

(65) Prior Publication Data

US 2011/0064246 A1    Mar. 17, 2011

Related U.S. Application Data

(60) Provisional application No. 61/242,871, filed on Sep. 16, 2009.

(51) Int. Cl.
*H03G 3/00* (2006.01)
*H04R 3/00* (2006.01)

(52) U.S. Cl.
USPC .......................................... 381/107; 381/122

(58) Field of Classification Search
USPC ........ 381/122–123, 312, 314, 318, 107, 94.1; 348/255, 300
See application file for complete search history.

(56) References Cited

U.S. PATENT DOCUMENTS

| 7,733,395 | B2 * | 6/2010 | Chou | 348/255 |
| 8,175,293 | B2 * | 5/2012 | Suvanto | 381/111 |
| 2003/0091207 | A1 * | 5/2003 | Killion et al. | 381/321 |

* cited by examiner

*Primary Examiner* — Vivian Chin
*Assistant Examiner* — Ammar Hamid
(74) *Attorney, Agent, or Firm* — Fitch, Even, Tabin & Flannery LLP

(57) ABSTRACT

An interface is provided between a transducer and audio processing circuitry. The interface has a switching device coupled to the transducer. The interface also has a first signal path that is selectively coupled to transducer via the switching device and includes a first output, the first signal path being configured to selectively receive input signals from the transducer, and form a first output signal at the first output by amplifying the input signals to provide a first gain. The first output is coupled to the audio processing circuitry. A second signal path is provided that is selectively coupled to the transducer via the switching device and includes a second output. The second gain is selected to be substantially larger than the first gain. The switching device is configured to switch the input signal between the first signal path and the second signal path.

8 Claims, 5 Drawing Sheets

MICROPHONE INTERFACE AND METHOD OF OPERATION

CROSS REFERENCE TO RELATED APPLICATION

This patent claims benefit under 35 U.S.C. §119(e) to U.S. Provisional Application No. 61/242,871 entitled "Microphone Interface and Method of Operation" filed Sep. 16, 2009 the content of which is incorporated herein by reference in its entirety

TECHNICAL FIELD

This application relates to microphone systems and, more specifically, to microphone interface circuits in these systems.

BACKGROUND OF THE INVENTION

Various types of microphones have been used in various applications through the years. Microphones typically receive acoustic energy and convert this acoustic energy into a voltage. This voltage can be further processed for other applications or purposes. For example, in a hearing aid system the microphone may receive acoustic energy, convert the acoustic energy to voltages, amplify or otherwise process the voltages and present the now-amplified acoustic energy to a user or wearer of the hearing aid. Microphones in cellular phones typically receive the sound energy, convert this energy into a voltage, and this voltage can be further processed for use in the cellular phone or for transmission. Microphones are used in other applications as well.

An interface is often used between the microphone and further processing functions and this interface sometimes employs analog-to-digital conversion circuitry. In particular, this circuitry converts analog signals produced by the microphone into digital signals so that further processing can be performed. This circuitry also has operational limits such that if too much voltage and/or current is applied, it will not function properly.

Today's microphones produce increasingly higher amounts of energy. For example, microphones in cellular phones may be employed to capture not only normal conversations but louder (i.e., high energy sounds) such as music (e.g., from concerts) or the like. These high energy signals produce increased amounts of energy that are eventually presented as high voltages to the interface circuits mentioned above. Unfortunately, the heightened voltage levels often overwhelm the interface circuits. For example, when the interface circuitry includes analog-to-digital circuits that deploy amplifier stages, the amplifier stages can become saturated and the system may then not function properly.

In another example, MEMS microphones often have an operating range that is higher than the interface circuitry. For example, MEMS microphones may be capable of processing signals with 140 dB MAX SPL. Unfortunately, present interfaces handle a substantial lesser amount of energy (e.g., 120 db MAX SPL). This fact leads to wasted capacity that can never be utilized by the user or the system.

BRIEF DESCRIPTION OF THE DRAWINGS

For a more complete understanding of the disclosure, reference should be made to the following detailed description and accompanying drawings wherein.

Figure 1:
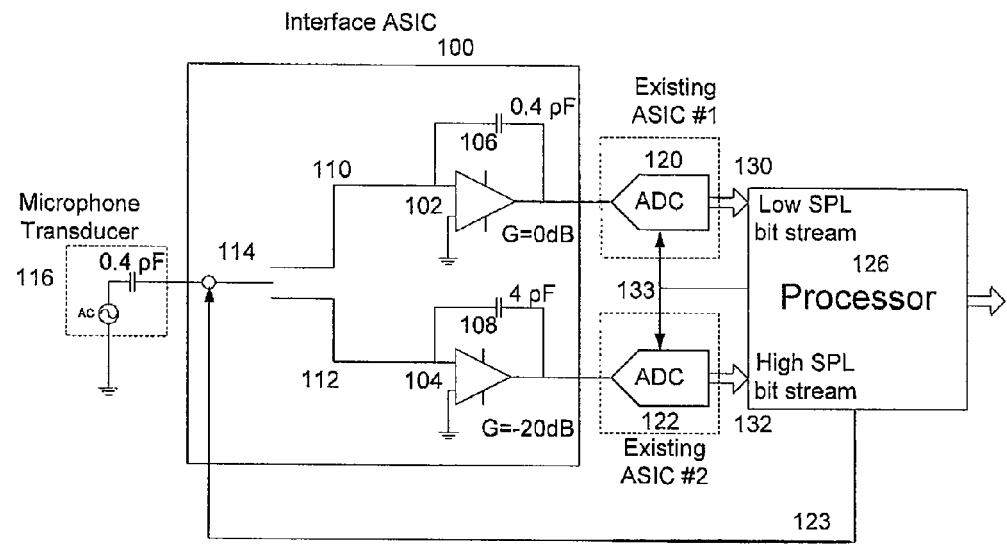
FIG. 1 comprises a block diagram and circuit diagram of a microphone system including an interface according to various embodiments of the present invention.

Skilled artisans will appreciate that elements in the figures are illustrated for simplicity and clarity. It will further be appreciated that certain actions and/or steps may be described or depicted in a particular order of occurrence while those skilled in the art will understand that such specificity with respect to sequence is not actually required. It will also be understood that the terms and expressions used herein have the ordinary meaning as is accorded to such terms and expressions with respect to their corresponding respective areas of inquiry and study except where specific meanings have otherwise been set forth herein.

DETAILED DESCRIPTION

The present approaches provide a microphone interface that is configured to receive high amounts of current or voltage from a microphone and to process these high value signals in such a way so as to not adversely impact the operation of the interface or additional processing circuitry that is coupled to the interface. In so doing, the full operating range of microphones (e.g., MEMS microphones) can be realized and utilized. These approaches are also flexible in that the interface can comprises a separate element (e.g., a separate application specific integrated circuit (ASIC)) or the interface may be integrated with the further processing circuit onto a single element (e.g., a single ASIC).

As used herein, the terms "higher" or "increased" in association with microphone signal levels produced refer to amounts of energy in excess of approximately 120 db MAX SPL. This value corresponds to values higher than those provided by typical existing systems. However, this value is approximate and other values are possible. In other words, the scope of the invention described herein is not in any way limited by this value.

Also, in many of the examples described herein the various components are described as operating in cellular phone. However, it will be appreciated that the approaches described herein can be deployed in a variety of systems including cellular phone, any audio/visual system, hearing aids, stereo or music systems to name a few examples, In many of these embodiments, current/charge amplification is performed at an interface disposed between a microphone and additional processing circuitry. Voltage amplification is not performed at the interface. Current is received from the microphone and the received current is split into two processing paths at the interface. Consequently, higher energy SPL signals are able to be received and processed. A switch at the interface is used to synchronously switch the current/charge on to two virtual grounds of each of the two signal paths. The switch is operated by a control signal from a controller or other processing device. A feedback capacitor is used in each signal path and this capacitor sets the gain of the signal transmitted by the path. The feedback capacitor also acts to maintain the voltage in each signal path even when the signal path is not connected to the microphone by the switch. Consequently, existing analog-to-digital converter stages may be used and coupled to the interfaces described herein. In some arrangements, the control signal is synchronized with the other processing stages (e.g., the analog-to-digital converter stages).

The approaches described herein result in the placement of two parallel signal paths with different gains after the microphone. However, since the microphone has such a low source capacitance, the two parallel signal paths would load the microphone excessively so the approaches described herein use switching to sequentially and alternately load the microphone with the two different signal paths. In these approaches, a current or charge mode is used because the maximum voltage entering each signal path can be limited. If voltage amplifiers or voltage amplification were used, the switching element would likely become overloaded.

Referring now to FIG. 1, one example of an interface circuit 100 is described. The interface circuit (e.g., an ASIC) 100 includes a first amplifier 102 and a second amplifier 104. A first feedback capacitor 106 is coupled across the first amplifier 102 and a second feedback capacitor 108 is coupled across the second amplifier 104. The amplifiers 102 and 104 provide a gain or attenuation to their respective input signals. The capacitors 106 and 108 determine the amount of gain or attenuation of signals processed by the amplifiers 102 and 104. In one example, the capacitor 106 is a 0.4 pf capacitor and provides a gain/attenuation of approximately one (0 dB) and the capacitor 108 is a 4 pF capacitor and provides an attenuation of 10 (−20 dB). Other examples are possible. The amplifiers 102 and 104 are, in one example, operational amplifiers and have their negative terminal connected to a switch 114 and their positive terminal connected to ground. In other examples, the positive terminal may be coupled to a reference DC level.

A first signal path 110 includes the first amplifier 102 and the first capacitor 106. A second signal path 112 includes the second amplifier 104 and the second capacitor 108. The switch 114 switches the signal from a source (e.g., any type of microphone) between the first path 110 and the second path 112. The switch 114 is controlled by a processor 126. Consequently, incoming current from source 116 (e.g., a MEMS microphone to name one example of a microphone) is amplified and or attenuated by the interface 100 before being further processed. Other types of sources and microphones are possible.

The first path 110 couples to a first analog-to-digital converter 120 and the second path couples to a second analog-to-digital converter 122. The analog-to-digital converters 120 and 122 convert the analog ac signals from the interface 100 (and the paths 110 and 112) to a first digital signal 130 (representing a low sound pressure level (SPL) stream) and a second digital signal 132 (representing a high SPL stream). The streams 130 and 132 are coupled to a processor 126.

In other examples, the streams are combined into a single high range signal, and no choice is made as between the two streams. In this case, the two streams are sent to and through a decimation filter, and from the decimation filter to a processing block where the streams are combined, for example, using an intelligent combining technique as known to those skilled in the art. In one example, from the processing block, a single (24-bit) pulse code modulation (PCM) data stream is output for further processing. The data streams described herein may also be pulse density modulation (PDM) data streams or utilize any other modulation techniques as known to those skilled in the art.

The processor 126 (e.g., any programmed control device such as a microprocessor or the like) is configured to receive the streams 130 and 132 from the converters 120 and 122 and form a control signal 123 that is used to control the switch 114. The processor 126 also generates control signal 133 to control operation of the converters 120 and 122 such that all devices operate synchronously. The processor 126 determines how to activate the switch 114 based upon information from the streams 130 and 132. If the processor 126 determines that the bit stream 132 is too low a value (i.e., too low of an energy), the control signal 123 causes the switch 114 to the couple the path 110 the source 116. If the processor 126 determines that the energy of the stream 130 is too high a value (i.e., too high an energy), then the control signal 123 causes the switch 114 to couple the path 112 to the source 116. The thresholds used for these determinations may vary. In other embodiments, the control signals 123 and 133 are omitted.

In some examples an AC signal is used, and the peak-to-peak value of the signal is examined. If the peak-to-peak value reaches full scale then the lower gain signal path is selected. A single event (e.g., spike which causes over load) may be ignored so, in this case, a time factor or delay is introduced to this allow for this decision to be made. In this case, hysteresis is applied so that the determination as to channel choice is not constantly changing. Advantageously, these approaches provide for both a low gain and a high gain channel to exist simultaneously and independently of each other. A decision can then be made about which channel to use as a post-processing activity.

In another approach, a single converter may be used. In this case, a second switch may be coupled to the single converter and switch the output of the paths 110 or 112 to the second switch. The single converter, in this example, is coupled to the processor 126.

In one example of the operation of the system of FIG. 1, the microphone source 116 sends analog signals representing speech to the interface 100. This signal is received at the switch 114. The switch 114 directs the signal to one of the paths 110 or 112. The amplifiers 102 or 104 apply their respective gain/attenuation to amplify the input current signal (and not amply the input voltage) and then the signal is transmitted to the converters 120 or 122 where analog-to-digital conversion is performed. From the converters 120 or 122, the digital streams 130 and 132 are sent to the processor 126. The processor 126 analyzes the streams 130 and 132 and if the values indicated in these streams indicate that the signal is too low a value and the switch is connecting the path 112 to the microphone 116, the switch 114 is caused to switch the other path 110 to the microphone 116. On the other hand, if the values indicated by the streams are too high and the switch 114 is connecting the path 110 to the microphone 116, the control signal 123 is activated to couple the microphone source 116 to the path 112. Typically, the switch 114 operates very quickly (e.g., approximately 100 kHz or more) and because of the fast switching and the presence of the capacitors 106 and 108, a signal will typically always be present along each of the paths 110 and 112. In one approach (and as described herein with respect to FIG. 5), the switch 114 toggles continuously and the monitoring by the processor 126 toggles based upon the values being monitored. In another approach (and as described herein with respect to FIG. 6), the monitored values themselves are used to directly toggle the switch 114.

In yet another approach, both bit streams (i.e., the low SPL bit stream and the high SPL bit stream) are monitored simultaneously. In this case, the processor toggles which bit stream is sent onward for further processing. In other words, the only function toggled relates to the processing of the information (e.g., ignore the information in the bit stream or send the information in the bit stream onward for further processing). The determination by the processor as to which bit stream is selected for further processing and which bit stream is to be ignored may be made according to the approaches described herein.

Consequently, current/charge amplification is used in an interface to allow increased or heightened SPL signals to be received from microphones. In this regard, the operational ranges of MEMS microphones can be fully utilized. Further, two paths are used and a switch controls the transmission of the input signal from the microphone to these paths. The paths are configured to maintain the signal even when the path is not connected to the microphone input. Consequently, the interface can be coupled to existing systems.

Figure 7:
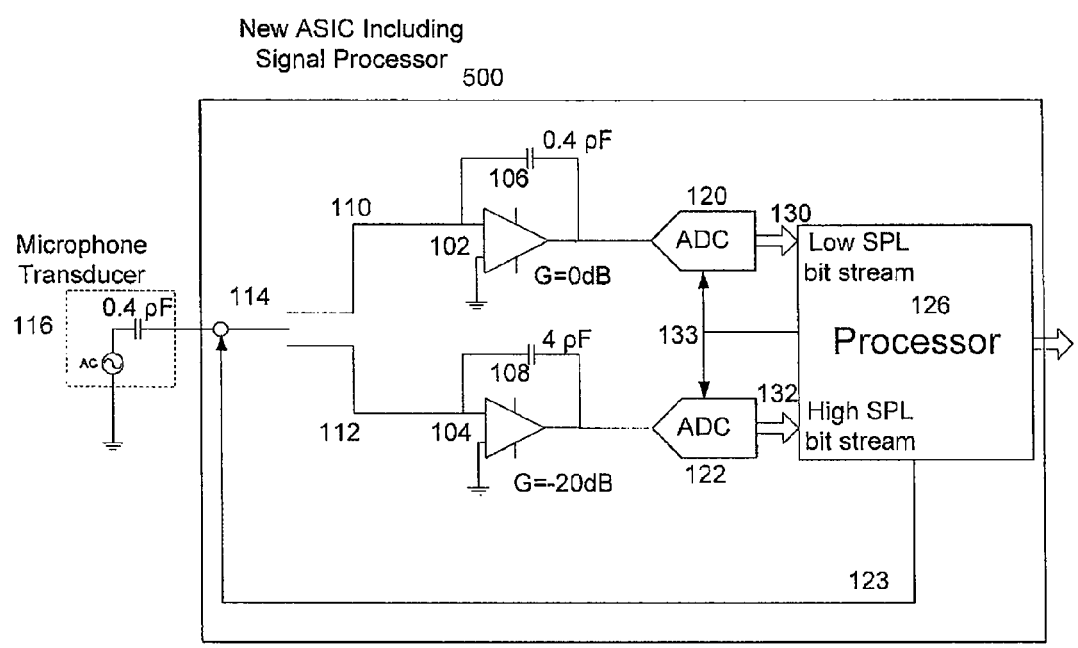
FIG. 7 comprises a block diagram and circuit diagram of a microphone system according to various embodiments of the present invention.

Referring now to FIG. 7, another example of an approach where various circuitry is disposed upon a single element (e.g., a single semiconductor package such as an ASIC). In this case, the interface 100 (of FIG. 1), the converters 120 and 122, and the processor 126 are disposed on a single ASIC 500. The other elements are the same as those described with respect to FIG. 1 and will not be discussed further here. As can be appreciated, part count is further reduced in this example, resulting in greater potential cost savings.

Figure 2:
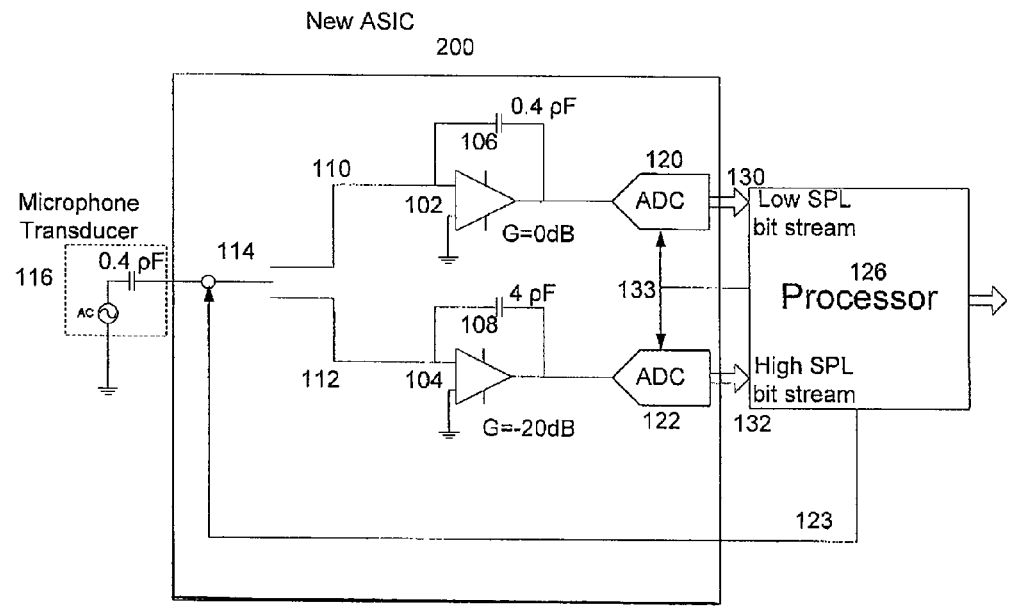
FIG. 2 comprises a block diagram and a circuit diagram of a microphone system including an interface according to various embodiments of the present invention with various elements disposed on a single element.

Referring now to FIG. 2, one example of an approach where various circuitry is disposed upon a single element (e.g., a single semiconductor package such as an ASIC). In this case, the interface 100 (of FIG. 1) and the converters 120 and 122 are disposed on a single ASIC 200. The other elements are the same as those described with respect to FIG. 1 and will not be discussed further here. As can be appreciated, part count is reduced in this example resulting in cost savings.

Figure 3:
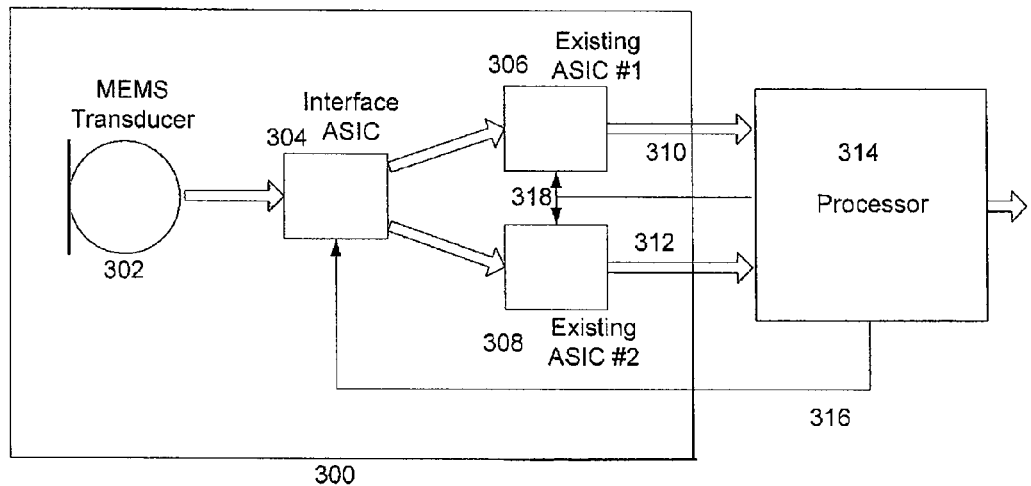
FIG. 3 comprises a block diagram of a microphone system including an interface according to various embodiments of the present invention.

Referring now to FIG. 3, one example of a microphone system 300 is described. A microphone 302 (e.g., a MEMS microphone) receives acoustic energy. The acoustic energy is passed from the microphone 302 as electrical current and voltage to an interface ASIC 304. As has been described above with respect to FIG. 1, the interface on the ASIC 304 has two amplification paths and a switch that switches the input from the microphone 302 between these paths. The interface ASIC 304 is separately coupled to a first existing ASIC 306 and a second existing ASIC 308. The ASICs 306 and 308 may, in one example, perform analog-to-digital conversion functions. The ASICS 306 and 308 produce digital streams 310 and 312, which are transmitted to a processor 314. In one example, the processor 314 may be part of a cellular phone. The processor 314 forms a control signal 316 that controls the switch in the interface ASIC 304 and another control signal 318 to control the operation of the ASICs 306 and 308. It will be appreciated that the processor 314 may perform other functions depending upon the system where it is used. For example, if used in a cellular phone, it may perform further signal processing functions or analysis on the received signal. It may also couple to transmission and receiver circuits that transmit and receive this and other signals to or from the cellular phone.

Figure 4:
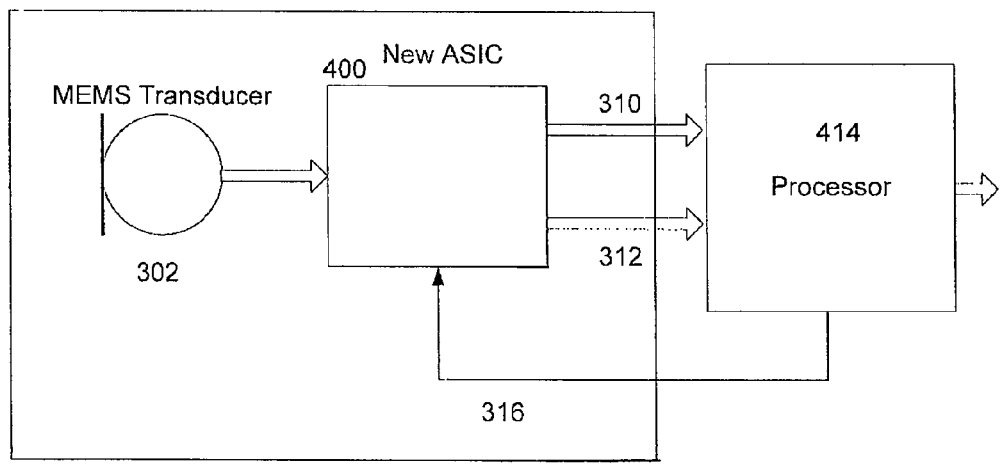
FIG. 4 comprises a block diagram of another example of a microphone system including an interface according to various embodiments of the present invention.

Referring now to FIG. 4, another example of a microphone system is described. This example is similar to the example of FIG. 3, except that the interface ASIC and existing ASICs have been combined into one ASIC 400. That is, the functions of the interface ASIC are combined with those of one existing ASIC. Since most the elements of FIG. 4 have been described with respect to FIG. 3, they will not be described again here. As with the example of FIG. 2, reduced part count is achieved resulting in cost savings.

Figure 5:
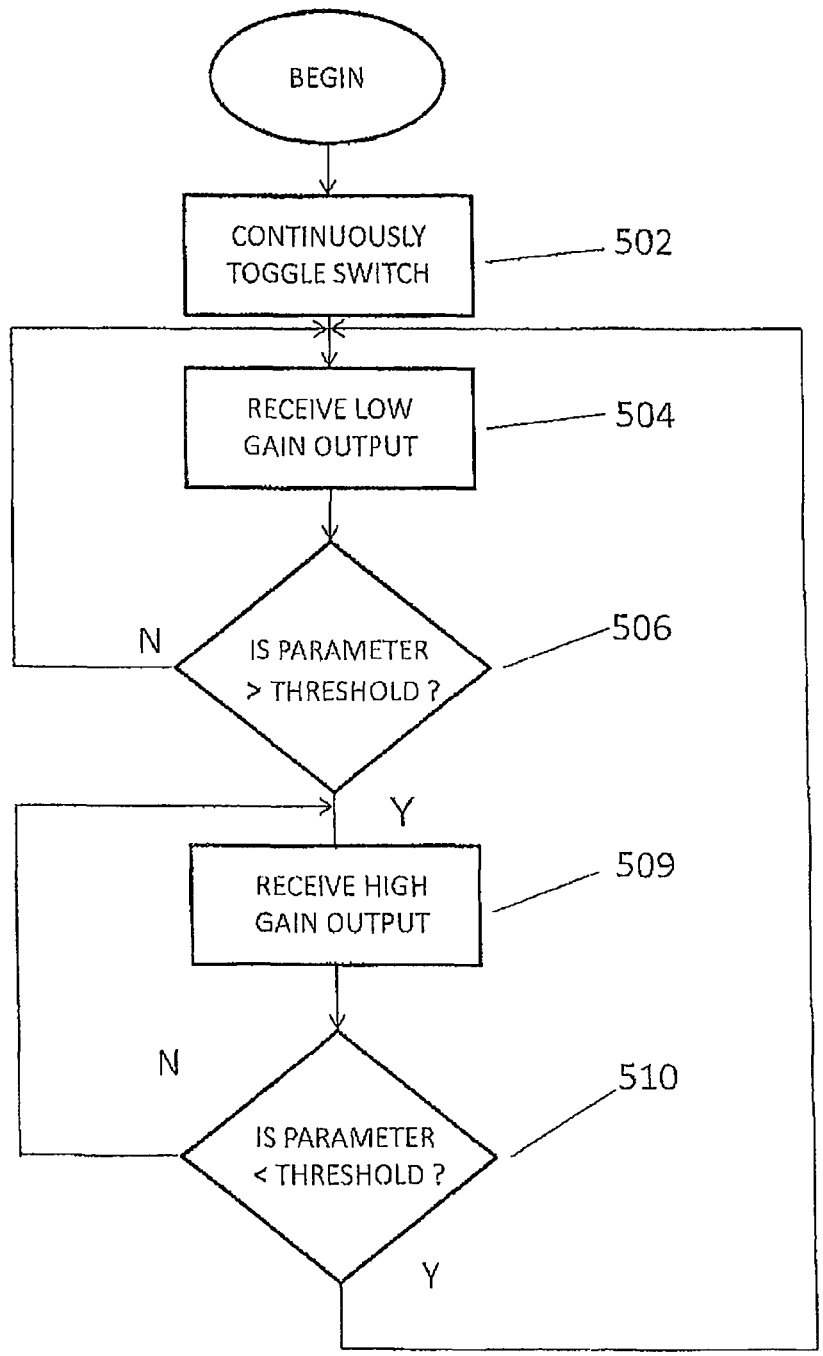
FIG. 5 comprises a flowchart of an approach for monitoring bit streams in an interface and controlling a switch according to various embodiments of the present invention.

Referring now to FIG. 5, one example of an approach for monitoring bit streams in an interface and controlling a switch in the interface is described (e.g., in this example, employing the system of FIG. 1). In this example, the switch (e.g., the switch 114) is constantly switching back and forth (e.g., at a rate of approximately 100 kHz or more), connecting the microphone (e.g., the microphone 116) to signal paths (e.g., signal paths 110 or 112) one at a time. The processor (e.g., the processor 126) examines both signal paths, one at a time. The processor (e.g., the processor 126) monitors the low SPL path (e.g., the path 110). If its peak-to-peak signal remains below full scale for a period of time (chosen by the application but typically on the order of 10s of milliseconds), the processor (e.g., the processor 126) will utilize or pass on the low SPL signal path (e.g., path 110). If however, the peak-to-peak signal on the low SPL path (e.g., path 110) exceeds the full scale limit during the chosen period of time, the processor (e.g., processor 126) will utilize or pass on the high SPL signal path (e.g., path 112). As is commonly known to those skilled in the art, adding hysteresis to the decision making process can avoid oscillation of the decision between the low and high SPL channels (e.g., paths 110 and 112). Depending upon the path monitored by the processor (e.g., the processor 126), the information present in that path may be further processed by other functional elements or by other applications. For example, the information may be further processed by other processing elements in the cellular telephone as know by those skilled in the art.

More specifically, at step 502, the switch is continuously being toggled at some predetermined rate (e.g., approximately 100 kHz or more). At step 504, a low SPL bit stream is received and monitors. The high SPL bit stream is not monitored. At step 506, it is determined if the value represented by the bit stream is above a first threshold. If the answer is negative, control continues with step 504. If the answer is affirmative, control continues at step 508.

At step 508, the high SPL bit stream is received and monitored. The low SPL bit stream is not monitored. At step 510, it is determined if the value of the high SPL bit stream is less than a threshold. If the answer is negative, control continues with step 508 as described above. If the answer at step 510 is affirmative, then control continues with step 504 as described above.

Figure 6:
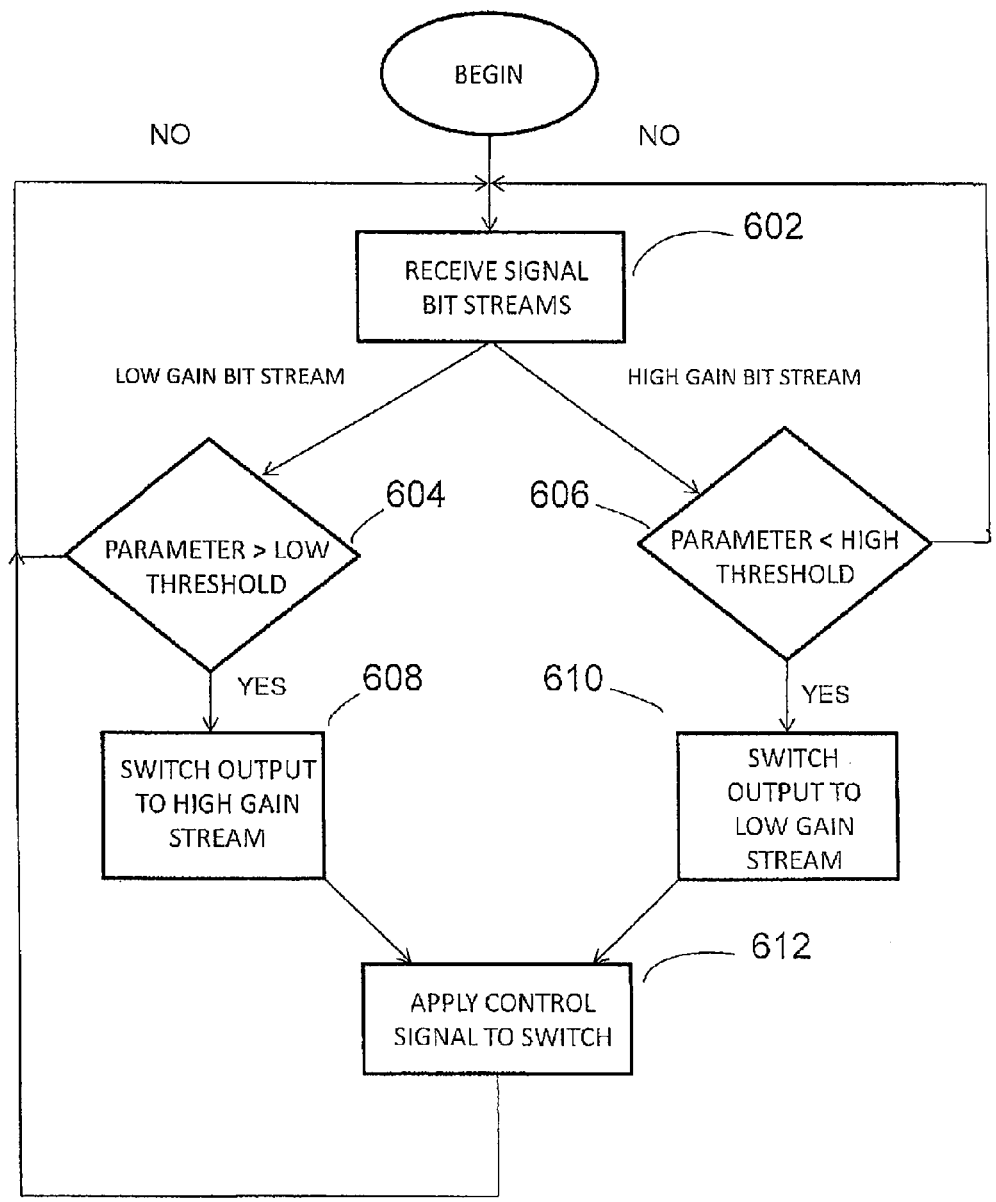
FIG. 6 comprises a flowchart of another approach for monitoring bit streams in an interface and controlling a switch of an interface according to various embodiments of the present invention.

Referring now to FIG. 6, another example of an approach to a control a switch is described. In this example, actuation of the switch is controlled by the algorithm (as compared to the approach of FIG. 5 where the switch continuously toggles back and forth and the processor toggles between monitoring the two bit streams). This example may also use the elements found in FIG. 1.

At step 602, the high and low SPL bit streams are received from the analog-to-digital conversion circuitry (e.g., one or more analog-to-digital converters). At step 606, the processor (e.g., processor 126) monitors the low SPL path (e.g., path 110) and if its peak-to-peak signal remains below full scale for a period of time (chosen by the application but typically on the order of 10s of milliseconds), the processor (e.g., processor 126) will utilize or pass on the low SPL signal path (e.g., path 110) at step 610. At step 604, if however, the peak-to-peak signal on the low SPL path (e.g., the path 110) exceeds the full scale limit during the chosen period of time, the processor (e.g., the processor 126) will utilize or pass on the high SPL signal path (e.g., path 112) at step 608. As is commonly known to those skilled in the art, adding hysteresis to the decision making process can avoid oscillation of the decision between the low and high SPL channels (e.g., paths 110 and 112). Control continues at step 612 where the control signal is applied to the switch.

While the present disclosure is susceptible to various modifications and alternative forms, certain embodiments are shown by way of example in the drawings and these embodiments will be described in detail herein. It will be understood, however, that this disclosure is not intended to limit the invention to the particular forms described, but to the contrary, the invention is intended to cover all modifications, alternatives, and equivalents falling within the spirit and scope of the invention.

Preferred embodiments of this invention are described herein, including the best mode known to the inventors for carrying out the invention. It should be understood that the illustrated embodiments are exemplary only, and should not be taken as limiting the scope of the invention.

The invention claimed is:

1. An interface between a single transducer and audio processing circuitry, the interface comprising: a switching device that is coupled to the single transducer and that is configured to receive input signals from the transducer; a first signal path that is selectively coupled to the single transducer via the switching device and that includes a first output, the first signal path being configured to selectively receive the input signals from the single transducer, forms a first output signal at the first output by amplifying the input signals to provide a first gain, the first output being coupled to the audio processing circuitry; a second signal path that is selectively coupled to the single transducer via the switching device and that includes a second output, the second signal path being configured to selectively receive the input signals from the single transducer, forms a second output signal at the second output by amplifying the input signals to provide a second gain, the second gain being selected to be substantially larger than the first gain, the second output being coupled to the audio processing circuitry; such that the switching device is configured to switch the input signal between the first signal path and the second signal path based upon at least one measured electrical parameter of the first output signal or at least one electrical parameter of the second output signal; wherein the first signal path provides a first voltage at the first output and the second signal path provides a second voltage at the second output, and the first voltage and the second voltage are maintained even when the first signal path or the second signal path are disconnected from the switching device.

2. An interface between a single transducer and audio processing circuitry, the interface comprising: a switching device that is coupled to the single transducer and that is configured to receive input signals from the transducer; a first signal path that is selectively coupled to the single transducer via the switching device and that includes a first output, the first signal path being configured to selectively receive the input signals from the single transducer, forms a first output signal at the first output by amplifying the input signals to provide a first gain, the first output being coupled to the audio processing circuitry; a second signal path that is selectively coupled to the single transducer via the switching device and that includes a second output, the second signal path being configured to selectively receive the input signals from the single transducer, forms a second output signal at the second output by amplifying the input signals to provide a second gain, the second gain being selected to be substantially larger than the first gain, the second output being coupled to the audio processing circuitry; such that the switching device is configured to switch the input signal between the first signal path and the second signal path based upon at least one measured electrical parameter of the first output signal or at least one electrical parameter of the second output signal; wherein the transducer is part of a microphone assembly, wherein a property detected at an output of the microphone assembly is indicative of a switching status of the switching device.

3. An interface between a single transducer and audio processing circuitry, the interface comprising: a switching device that is coupled to the single transducer and that is configured to receive input signals from the transducer; a first signal path that is selectively coupled to the single transducer via the switching device and that includes a first output, the first signal path being configured to selectively receive the input signals from the single transducer, forms a first output signal at the first output by amplifying the input signals to provide a first gain, the first output being coupled to the audio processing circuitry; a second signal path that is selectively coupled to the single transducer via the switching device and that includes a second output, the second signal path being configured to selectively receive the input signals from the single transducer, forms a second output signal at the second output by amplifying the input signals to provide a second gain, the second gain being selected to be substantially larger than the first gain, the second output being coupled to the audio processing circuitry; such that the switching device is configured to continuously switch the input signal between the first signal path and the second signal path, the switching between the first signal path and the second signal path providing simultaneous outputs at different gains.

4. The interface of claim 3 wherein the transducer is part of a microphone assembly.

5. The interface of claim 4 wherein the first signal path functions to achieve a desired signal-to-noise ratio for the microphone assembly.

6. The interface of claim 4 wherein the second signal path prevents saturation of the microphone assembly.

7. The interface of claim 4 further including: a processor in connection with the first signal path and the second signal path, wherein the processor selects either the first signal path or the second signal path based on an electrical parameter which is at least one selected from a group consisting of: signal amplitude, signal-to-noise ratio, and distortion.

8. The interface of claim 7 wherein a property detected at an output of the microphone assembly is indicative of a selection status of the processor.

* * * * *